(12) United States Patent
Lee et al.

(10) Patent No.: US 8,921,835 B2
(45) Date of Patent: Dec. 30, 2014

(54) ORGANIC LIGHT EMITTING DIODE DISPLAY

(75) Inventors: Jae-Seob Lee, Yongin (KR);
Chang-Yong Jung, Yongin (KR);
Yong-Hwan Park, Yongin (KR);
Kyung-Mi Kwon, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 70 days.

(21) Appl. No.: 13/423,689

(22) Filed: Mar. 19, 2012

(65) Prior Publication Data
US 2013/0062659 A1      Mar. 14, 2013

(30) Foreign Application Priority Data
Sep. 9, 2011 (KR) ................. 10-2011-0092150

(51) Int. Cl.
| H01L 51/00 | (2006.01) |
| H01L 29/786 | (2006.01) |
| H01L 27/12 | (2006.01) |
| H01L 51/52 | (2006.01) |
| H01L 27/32 | (2006.01) |

(52) U.S. Cl.
CPC ....... *H01L 29/78603* (2013.01); *H01L 51/5253* (2013.01); *H01L 2251/5338* (2013.01); *H01L 27/3244* (2013.01); *H01L 27/1218* (2013.01); *H01L 51/5256* (2013.01)
USPC ...................................... 257/40; 257/E51.04

(58) Field of Classification Search
CPC ......................... H01L 51/0048; H01L 51/0097
USPC ............... 257/103, 40, 642, E23.007, E51.04
See application file for complete search history.

(56) References Cited

U.S. PATENT DOCUMENTS

| 6,268,695 | B1 | 7/2001 | Affinito | |
| 7,960,718 | B2* | 6/2011 | Fink et al. | 257/40 |
| 2011/0114993 | A1* | 5/2011 | Lee et al. | 257/100 |
| 2011/0223697 | A1* | 9/2011 | Yong-Hwan et al. | 438/28 |
| 2011/0285951 | A1* | 11/2011 | Yoon et al. | 349/139 |

FOREIGN PATENT DOCUMENTS

| KR | 10-2007-0113672 | 11/2007 |
| KR | 10-2008-0101488 | 11/2008 |
| KR | 10-2010-0105965 | 10/2010 |

\* cited by examiner

*Primary Examiner* — Quoc Hoang
(74) *Attorney, Agent, or Firm* — Robert E. Bushnell, Esq.

(57) ABSTRACT

An organic light emitting diode display includes: a base film made of plastic; a thin film transistor and an organic light emitting diode formed on the base film; and a carbon nanotube thin film disposed among the base film, the thin film transistor, and the organic light emitting diode.

11 Claims, 6 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 9 of Sep. 2011 and there duly assigned Serial No. 10-2011-0092150.

BACKGROUND OF THE INVENTION

1. Field of the Invention

The present invention relates generally to an organic light emitting diode (OLED) display. More particularly, the invention relates to an organic light emitting diode (OLED) display for preventing damage caused by static electricity.

2. Description of the Related Art

Recently, a flexible flat display device, which is lightweight and resistant to impact, has been developed by utilizing a base film made of a material such as plastic.

The flexible flat display device includes an organic light emitting diode display element, a liquid crystal display element, and an electrophoretic display (EPD) element.

The flexible flat display device has a plurality of elements formed on a relatively thin plastic film so that it has to undergo multiple detaching processes for the purpose of acquiring stable manufacturing.

However, several tens to several hundred volts [V] of static electricity may occur during the detaching process. For example, static electricity of substantially 500 volts may be generated when a release paper attached to a protection film is removed.

When the elements are exposed to the several tens to several hundred volts [V] of static electricity occurring during the detaching process, they are damaged so as to cause problems.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide an organic light emitting diode (OLED) display for preventing damage caused by static electricity.

An exemplary embodiment provides an organic light emitting diode display including: a base film made of plastic; a thin film transistor and an organic light emitting diode formed on the base film; and a carbon nanotube thin film disposed among the base film, the thin film transistor, and the organic light emitting diode The organic light emitting diode display further includes a barrier layer disposed among the base film, the thin film transistor, and the organic light emitting diode.

The barrier layer is disposed between the base film and the carbon nanotube thin film.

The barrier layer further comprises a barrier layer disposed among the carbon nanotube thin film, the thin film transistor, and the organic light emitting diode.

The barrier layer includes a plurality of inorganic layers.

The barrier layer has a multi-layered configuration in which a silicon oxide layer and a silicon nitride layer are alternately stacked.

The base film is made of a material including a polyimide.

The organic light emitting diode display further includes a thin film encapsulating layer for covering the thin film transistor and the organic light emitting diode.

The thin film encapsulating layer includes at least one inorganic layer or at least one organic layer.

The base film, the thin film encapsulating layer, and the carbon nanotube thin film are formed so as to be flexible.

According to the exemplary embodiments, the organic light emitting diode (OLED) display prevents damage caused by static electricity.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

Constituent elements having the same structures throughout the embodiments are denoted by the same reference numerals and are described in a first exemplary embodiment. In the subsequent exemplary embodiments, only constituent elements other than the same constituent elements are described.

The drawings are schematic and are not proportionally scaled. Relative scales and ratios in the drawings are enlarged or reduced for the purpose of accuracy and convenience, and the scales are arbitrary and the embodiments are not limited thereto. In addition, like reference numerals designate like structures, elements or parts throughout the specification. It will be understood that, when an element is referred to as being "on" another element, it can be directly on another element or intervening elements may be present therebetween.

Exemplary embodiment views represent ideal exemplary embodiments in detail. As a result, various modifications of diagrams are expected. Accordingly, exemplary embodiments are not limited to specific shapes of shown regions, and for example, also include modifications of the shape by manufacturing.

An organic light emitting diode (OLED) display according to a first exemplary embodiment of the invention will now be described with reference to FIG. 1 and FIG. 2.

Figure 1:
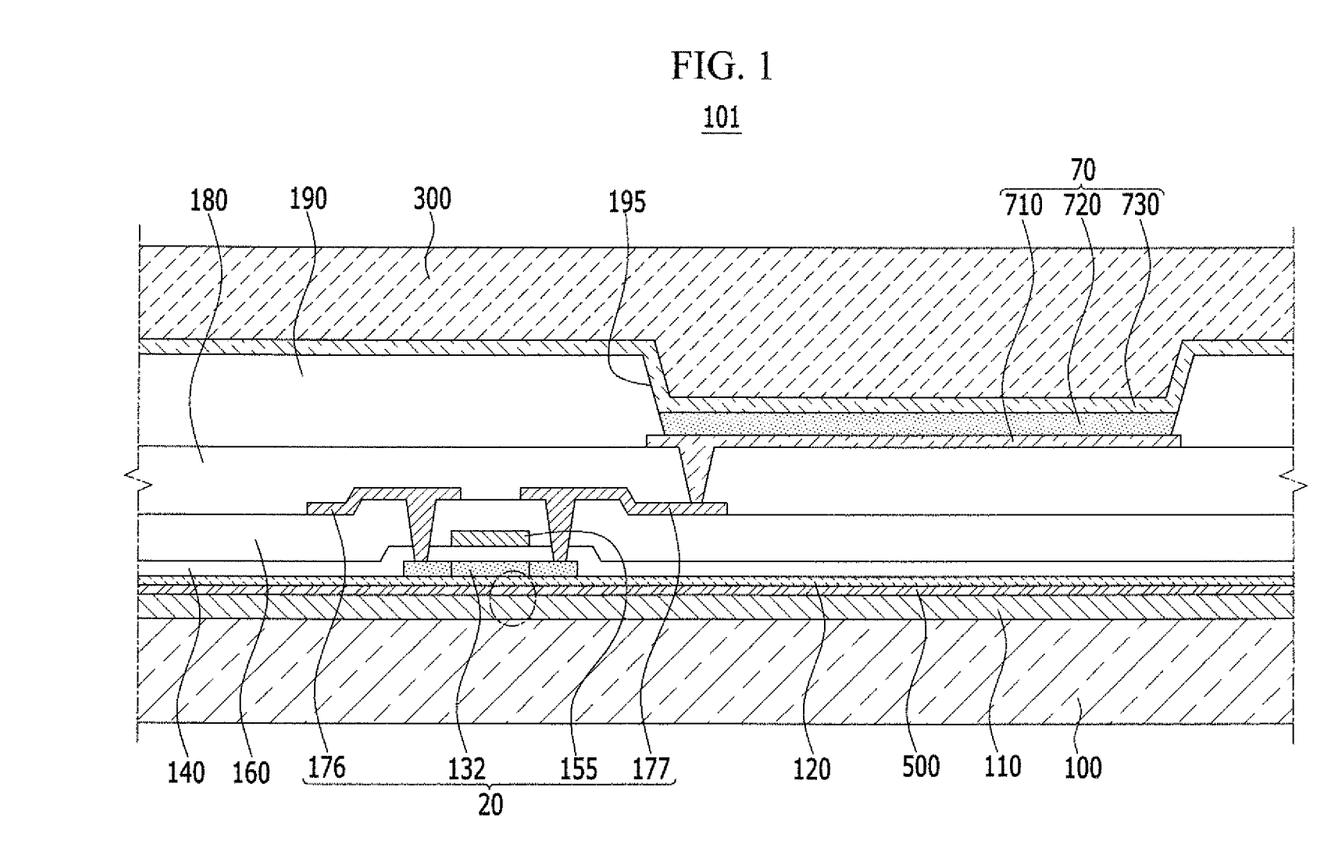
FIG. 1 is a cross-sectional view of an organic light emitting diode (OLED) display according to a first exemplary embodiment of the invention.

FIG. 1 is a cross-sectional view of an organic light emitting diode (OLED) display according to a first exemplary embodiment of the invention.

As shown in FIG. 1, the organic light emitting diode (OLED) display 101 includes a base film 100, a carbon nanotube (CNT) thin film 500, a thin film transistor 20, and an organic light emitting diode 70. The organic light emitting diode (OLED) display 101 further includes a barrier layer 110, a buffer layer 120, and a thin film encapsulating layer 300.

The thin film transistor 20 includes an active layer 132, a gate electrode 155, a source electrode 176, and a drain electrode 177. In the first exemplary embodiment, the thin film transistor 20 has a top gate configuration in which the gate electrode 155 is formed on the active layer 132.

The active layer 132 is made of a polysilicon layer that is generated by crystallizing an amorphous silicon layer by using laser beams. The crystallization method using laser beams can be an excimer laser annealing (ELA) method.

The organic light emitting diode (OLED) display 101 can further include a gate insulating layer 140 for insulating the active layer 132 of the thin film transistor 20 and the gate electrode 155, and an interlayer insulating layer 160 for insulating the gate electrode 155, the source electrode 176, and the drain electrode 177.

The organic light emitting diode 70 includes a pixel electrode 710 connected to the drain electrode 177 of the thin film transistor 20, an organic emission layer 720 formed on the pixel electrode 710, and a common electrode 730 formed on the organic emission layer 720. Here, the pixel electrode 710 is a positive (+) electrode (a hole injection electrode), and the common electrode 730 is a negative (−) electrode (an electron injection electrode). However, the first exemplary embodiment is not restricted thereto, and the pixel electrode 710 can be a negative electrode and the common electrode 730 can be a positive electrode depending on the method for driving the organic light emitting diode (OLED) display 101.

When holes and electrons are injected into the organic emission layer 720 by the pixel electrode 710 and common electrode 730, respectively, exitons which are combinations of the injected holes and the electrons enter the ground state from the exited state, and the organic emission layer 720 emits light.

The organic light emitting diode (OLED) display 101 can further include a pixel defining layer 190 for defining a light emitting area with an opening 195 for exposing the pixel electrode 710. The organic emission layer 720 is formed on the pixel electrode 710 in the opening 195 of the pixel defining layer 190.

The organic light emitting diode (OLED) display 101 can further include an additional insulating layer 180 for insulating the pixel electrode 710 and the source electrode 176. The additional insulating layer 180 has a planarization characteristic so as to allow the organic emission layer 720 to be uniformly formed on the pixel electrode 710.

Also, in the organic light emitting diode (OLED) display 101 according to the first exemplary embodiment, detailed configurations of the organic light emitting diode 70 and the thin film transistor 20 are not restricted to the configurations shown in FIG. 1. The organic light emitting diode 70 and the thin film transistor 20 are changeable in various ways within the range in which a skilled person in the art can easily modify them.

The base film 100 is made of plastic. In detail, the base film 100 can be made of a polyimide having excellent characteristics with respect to heat resistance, chemical resistance, durability, and electrical insulation. However, the first exemplary embodiment is not limited thereto, and the base film 100 may be made of polyethylene etherphtalate, polyethylene naphthalate, polycarbonate, polyarylate, polyetherimide, or polyethersulfone.

The carbon nanotube thin film 500 is disposed among the base film 100, the thin film transistor 20, and the organic light emitting diode 70.

The carbon nanotube thin film 500 controls static electricity which badly influences the thin film transistor 20 and the organic light emitting diode 70. During the manufacturing process of the organic light emitting diode (OLED) display 101, when the base film 100 is separated from a glass substrate (not shown), or when a release paper is removed from the base film 100 or a protecting film (not shown) attached to the base film 100, static electricity of several tens of volts [V] to several hundreds of volts [V] may occur. The carbon nanotube thin film 500 protects the thin film transistor 20 or the organic light emitting diode 70 from the static electricity.

The carbon nanotubes are formed so as to be long in a like manner of hair having a diameter that is less than several nanometers and a length that is from several hundreds of nanometer to several micrometers. The carbon nanotubes have relatively excellent conductivity, and excellent conductive thin films with less sheet resistance can be made with its thickness of several tens to several hundreds of micrometers. In detail, the carbon nanotubes are made of pure carbon nanotubes, or can be made by doping or absorbing a metal oxide, a semiconductor, a metal, a polymer, or a semiconductor oxide to the carbon nanotubes. The materials are combined with the carbon nanotubes so as to improve or reduce conductivity of the carbon nanotubes, and thereby control specific resistance of the carbon nanotubes.

The carbon nanotube thin film 500 made of the above-noted carbon nanotubes has transparency with great electrical conductivity. Therefore, the organic light emitting diode (OLED) display 101 can stably control the damage to the elements caused by static electricity.

The barrier layer 110 prevents permeation of moisture or oxygen. It is relatively easy for the moisture or oxygen to permeate into a base film 100 made of plastic compared to a substrate made of glass. Hence, the barrier layer 110 is formed on the base film 100 so as to control the moisture or oxygen which may permeate into the base film 100 and otherwise impart a bad influence on the organic light emitting diode 70 formed on the base film 100.

Figure 2:
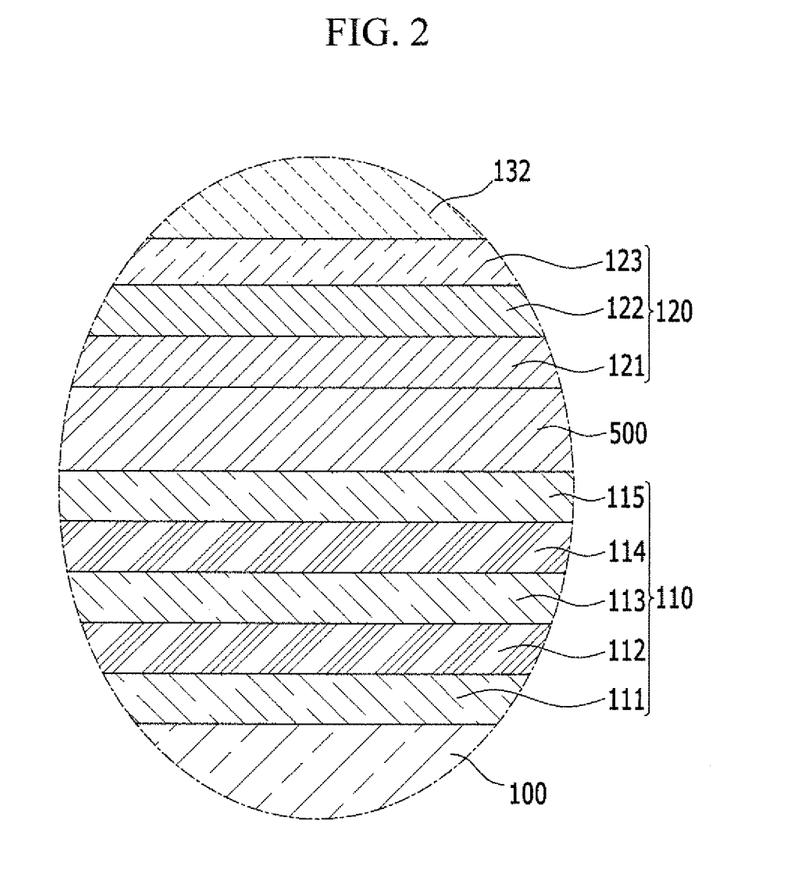
FIG. 2 is a cross-sectional view of a magnified part of FIG. 1.

FIG. 2 is a cross-sectional view of a magnified part of FIG. 1.

As shown in FIG. 2, the barrier layer 110 includes a plurality of inorganic layers (111, 112, 113, 114 and 115). In detail, the barrier layer 110 has a configuration in which silicon oxide layers 111, 113 and 115 and silicon nitride layers 112 and 114 are alternately stacked. However, the first exemplary embodiment is not restricted thereto, and the barrier layer 110 can include other kinds of inorganic layers.

In the first exemplary embodiment, the barrier layer 110 is disposed between the base film 100 and the carbon nanotube thin film 500.

The buffer layer 120 is formed on the carbon nanotube thin film 500. The buffer layer 120 includes at least one of a tetraethyl orthosilicate (TEOS) layer, a silicon nitride layer, a silicon oxide layer, and a silicon oxynitride layer. FIG. 2 shows a buffer layer 120 formed of triple layers generated by stacking the silicon nitride layer 121, the silicon oxide layer 122 and the TEOS layer 123. The buffer layer 120 additionally blocks moisture or oxygen passing through the barrier layer 110, and makes the surface planar so as to stably form the active layer 132.

The buffer layer 120 can be omitted from the organic light emitting diode (OLED) display 101 according to the first exemplary embodiment.

The active layer 132 of the thin film transistor 20 is formed on the buffer layer 120. As described above, the active layer 132 is formed by patterning the polysilicon layer generated by crystallizing the amorphous silicon layer by using laser beams.

The thin film encapsulating layer 300 of FIG. 1 can be formed with a configuration in which at least one of a plurality of inorganic layers and a plurality of organic layers is stacked. The thin film encapsulating layer 300 protects the organic light emitting diode 70, and it also controls permeation of moisture or oxygen into the organic light emitting diode 70 in a manner similar to that of the base film 100 and the barrier layer 110.

In the first exemplary embodiment, the base film, the carbon nanotube thin film, the barrier layer, and the thin film encapsulating layer can be formed so as to be flexible. Therefore, the organic light emitting diode (OLED) display 101 can be made flexible.

By means of the above-described configuration, the organic light emitting diode (OLED) display 101 can efficiently block damage caused by static electricity. Also, an organic light emitting diode (OLED) display 101 which is stably flexible can be manufactured.

A display device 102 according to a second exemplary embodiment will now be described with reference to FIG. 3 and FIG. 4.

Figure 3:
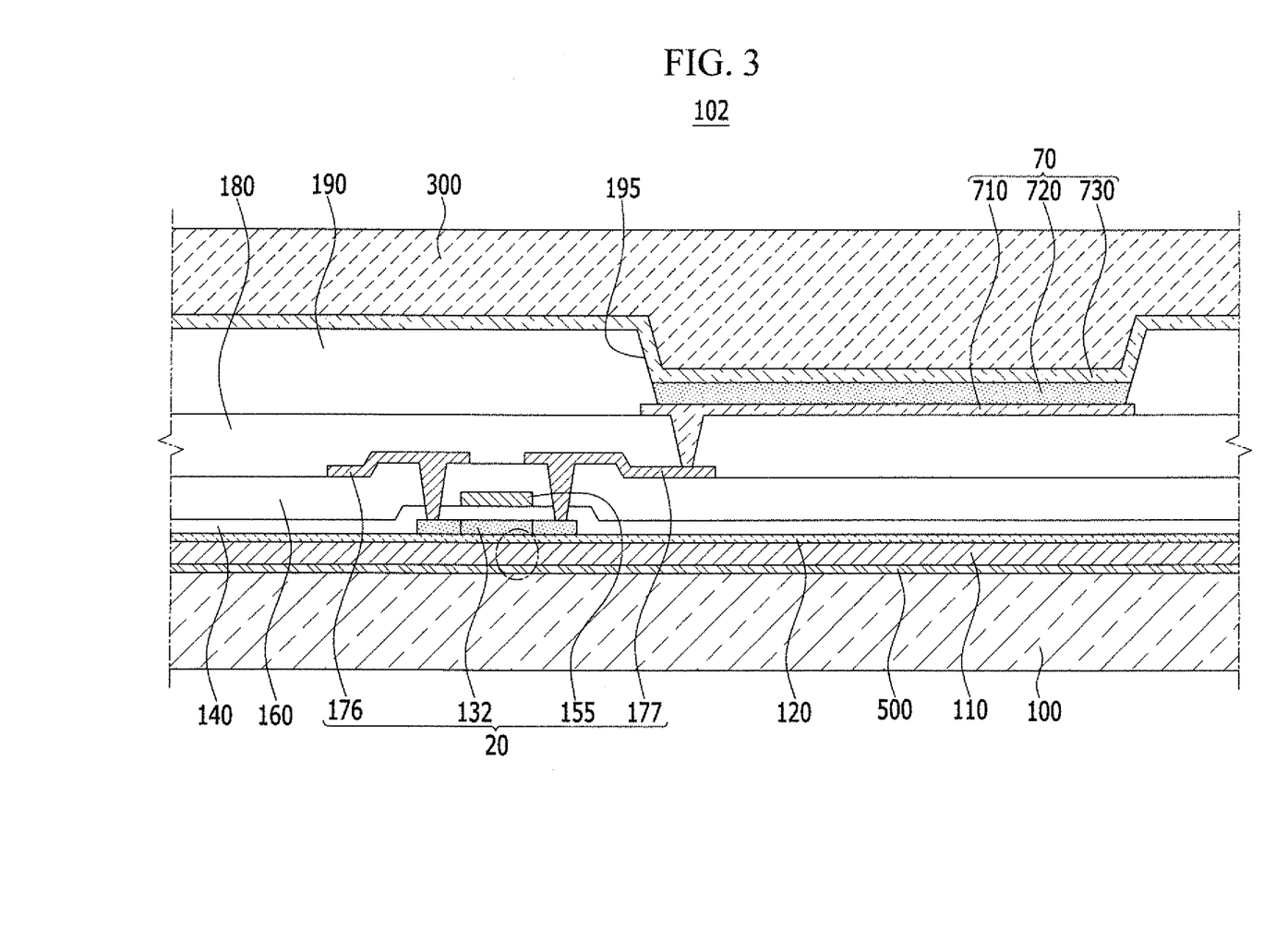
FIG. 3 is a cross-sectional view of an organic light emitting diode (OLED) display according to a second exemplary embodiment of the invention.
Figure 4:
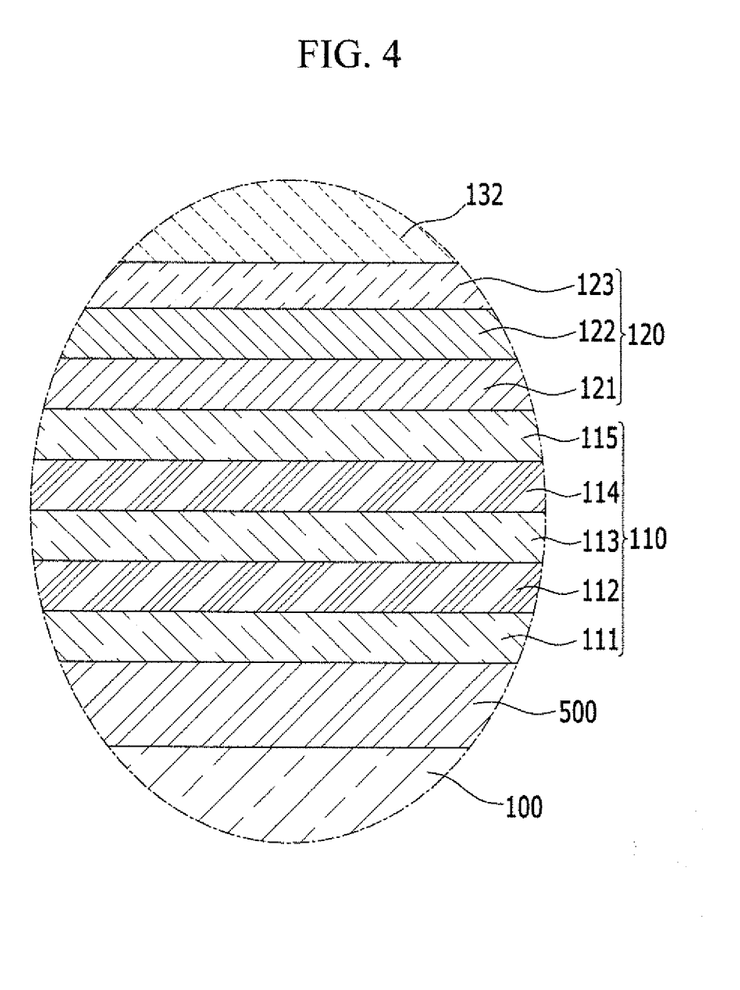
FIG. 4 is a cross-sectional view of a magnified part of FIG. 3.

FIG. 3 is a cross-sectional view of an organic light emitting diode (OLED) display according to a second exemplary embodiment of the invention; and FIG. 4 is a cross-sectional view of a magnified part of FIG. 3.

As shown in FIG. 3, in the display device 102, the carbon nanotube thin film 500 is disposed between the base film 100 and the barrier layer 110. That is, as shown in FIG. 4, the base film 100, the carbon nanotube thin film 500, and the barrier layer 110 are sequentially disposed in the second exemplary embodiment.

By the above-noted configuration, the display device 102 according to the second exemplary embodiment can efficiently prevent damage caused by static electricity. Furthermore, an organic light emitting diode (OLED) display 102 that is stably flexible can be manufactured.

A first experiment will now be described with reference to Table 1 and Table 2 below.

The first experiment is performed to compare static electricity characteristics of an Experimental Example including a carbon nanotube thin film to static electricity characteristics of a Comparative Example including no carbon nanotube thin film.

In the first experiment, the Experimental Example has a carbon nanotube thin film disposed between the base film made of polyimide and the glass substrate, and the Comparative Example has a configuration equivalent to the Experimental Example except for the omission of the carbon nanotube thin film.

TABLE 1

| Static electricity gun | Experimental Example | Comparative Example |
| --- | --- | --- |
| 2 KV | 1.7-2 KV | 0 KV |

Table 1 shows an experimental result values of how much static electricity is induced by using a static electricity gun and applying 2 KV.

As shown in Table 1, the Experimental Example which includes a carbon nanotube thin film induces most of the static electricity. Conversely, the Comparative Example does not induce the static electricity.

TABLE 2

|  | Experimental Example | Comparative Example |
| --- | --- | --- |
| Static electricity | 0.2-0.5 KV | 2-10 KV |

Table 2 shows result values acquired by experimenting on how much the Experimental Example and the Comparative Example block the static electricity when a release paper attached to a base film is removed.

As shown in Table 2, the Comparative Example generates a relatively large amount of static electricity when the release paper is removed. That is, the Experimental Example which includes a carbon nanotube thin film produces a static electricity control effect that is more than ten times the control effect of the Comparative Example.

A second experiment will now be described with reference to FIG. 5 and FIG. 6.

Figure 5:
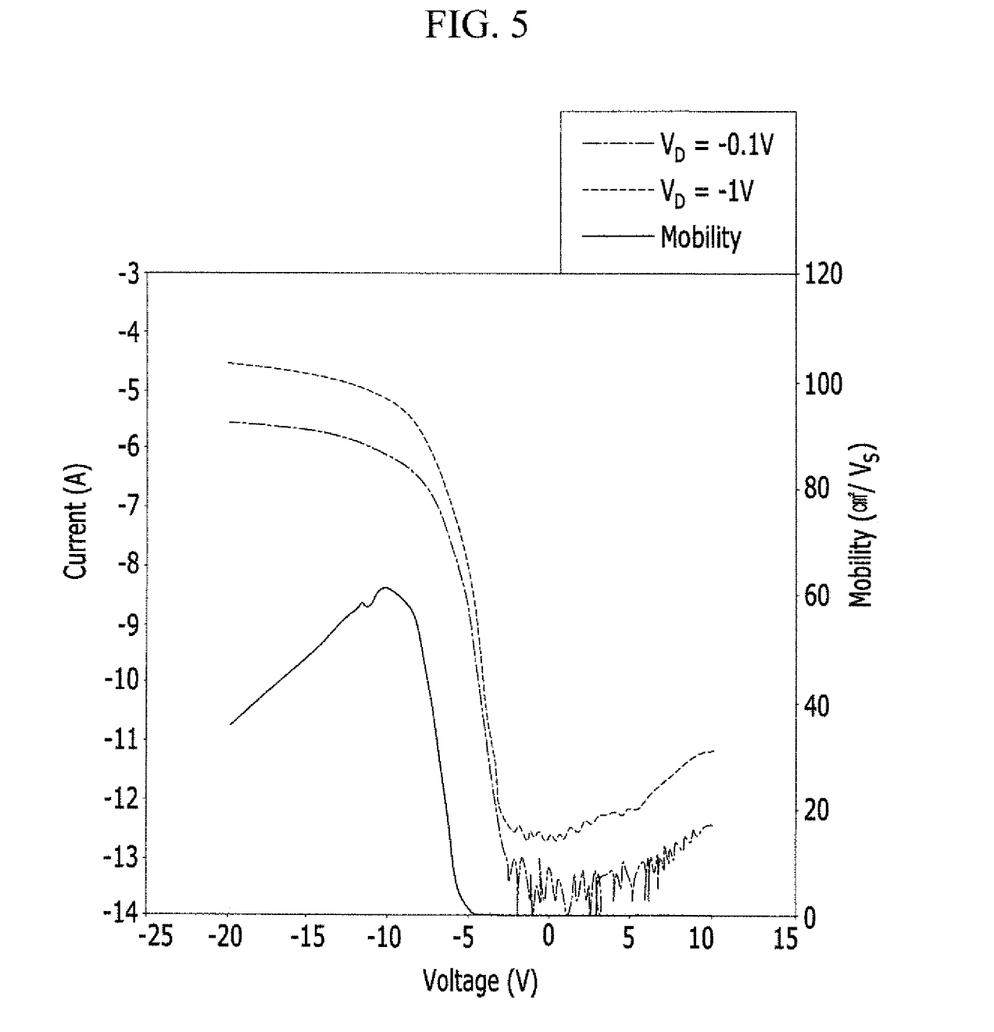
FIG. 5 and FIG. 6 are graphs indicating the performance of elements in an Experimental Example and a Comparative Example according to a first exemplary embodiment of the invention.
Figure 6:
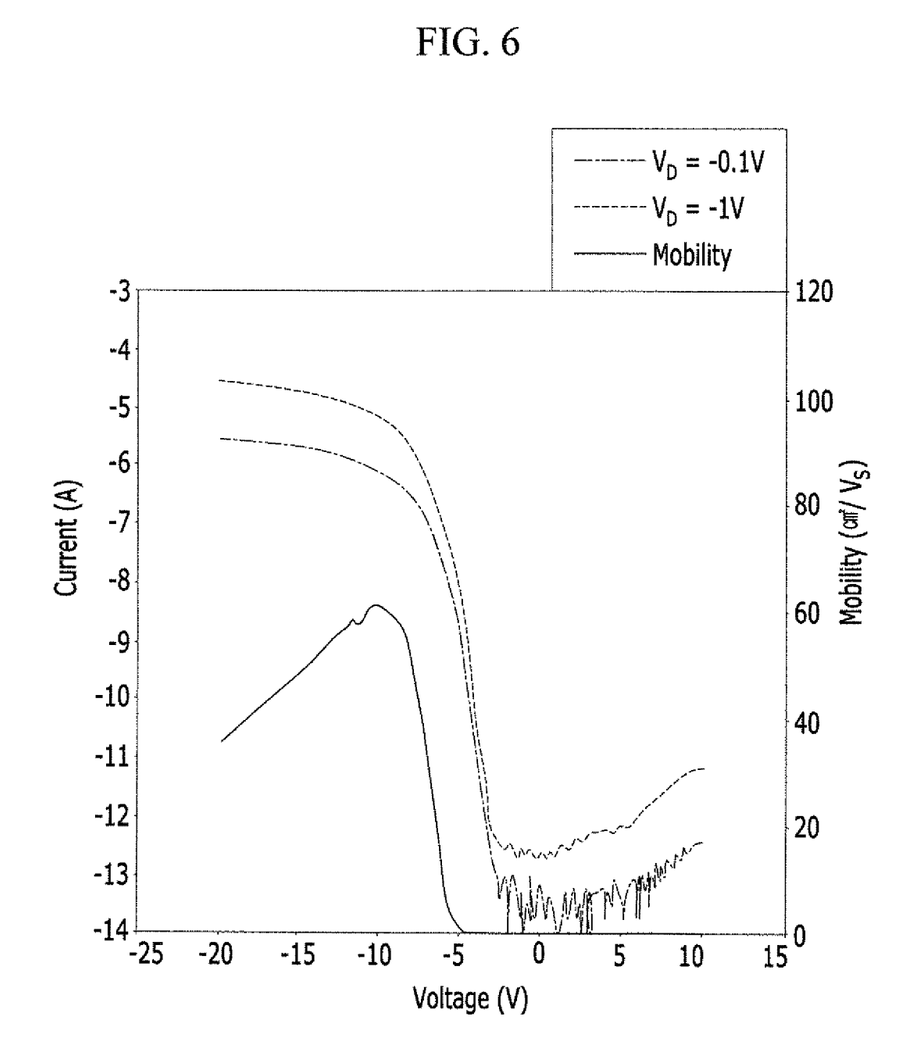

FIG. 5 and FIG. 6 are graphs indicating the performance of elements in an Experimental Example and a Comparative Example according to a first exemplary embodiment of the invention.

It was determined, through the second experiment, whether the organic light emitting diode (OLED) display, including a carbon nanotube thin film, can prevent damage to elements caused by static electricity according to the exemplary embodiment.

In the second experiment, the Experimental Example uses an organic light emitting diode (OLED) display manufactured according to the exemplary embodiment, and it is determined whether the thin film transistor is damaged when the release paper is removed from the base film to generate static electricity.

FIG. 5 shows electrical characteristics of a thin film transistor before static electricity is generated by removing the release paper from the base film, while FIG. 6 shows electrical characteristics of a thin film transistor after static electricity is generated by removing the release paper from the base film.

When FIG. 5 and FIG. 6 are compared, it is found that the electrical characteristics of the thin film transistor are not substantially changed. That is, the carbon nanotube thin film prevents the thin film transistor from being damaged by static electricity.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. An organic light emitting diode display device, comprising:
    a base film made of plastic;
    a carbon nanotube thin film disposed on the base film and extending across an entirety of the base film; and
    a thin film transistor and an organic light emitting diode formed on the carbon nanotube thin film.

2. The organic light emitting diode display device of claim 1, further comprising a barrier layer disposed among the base film, the thin film transistor, and the organic light emitting diode.

3. The organic light emitting diode display device of claim 2, wherein the barrier layer is disposed between the base film and the carbon nanotube thin film.

4. The organic light emitting diode display device of claim 2, wherein the barrier layer further comprises a barrier layer disposed among the carbon nanotube thin film, the thin film transistor, and the organic light emitting diode.

5. The organic light emitting diode display device of claim 2, wherein the barrier layer includes a plurality of inorganic layers.

6. The organic light emitting diode display device of claim 2, wherein the barrier layer has a multi-layered configuration in which a silicon oxide layer and a silicon nitride layer are alternately stacked.

7. The organic light emitting diode display device of claim 1, wherein the base film is made of a material including a polyimide.

8. The organic light emitting diode display device of claim 1, further comprising a thin film encapsulating layer for covering the thin film transistor and the organic light emitting diode.

9. The organic light emitting diode display device of claim 8, wherein the thin film encapsulating layer includes one of at least one inorganic layer and at least one organic layer.

10. The organic light emitting diode display device of claim 8, wherein the base film, the thin film encapsulating layer, and the carbon nanotube thin film are formed so as to be flexible.

11. An organic light emitting diode display device, comprising:
    a base film made of plastic;
    a carbon nanotube thin film disposed on the base film; and
    a thin film transistor and an organic light emitting diode formed on the carbon nanotube thin film.

* * * * *